United States Patent
Mizuno

(10) Patent No.: US 6,536,012 B1
(45) Date of Patent: Mar. 18, 2003

(54) DATABASE FOR DESIGNING INTEGRATED CIRCUIT DEVICE, AND METHOD FOR DESIGNING INTEGRATED CIRCUIT DEVICE

(75) Inventor: Masanobu Mizuno, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 85 days.

(21) Appl. No.: 09/637,871

(22) Filed: Aug. 15, 2000

(30) Foreign Application Priority Data

Aug. 26, 1999 (JP) .......................................... 11-239185

(51) Int. Cl.$^7$ ............................................. G06F 17/50
(52) U.S. Cl. ..................... 716/1; 716/1; 716/3; 716/5
(58) Field of Search ........................... 716/1–5, 14, 16, 716/18

(56) References Cited

U.S. PATENT DOCUMENTS

| | | | |
|---|---|---|---|
| 5,663,891 A | | 9/1997 | Bamji et al. ................. 364/490 |
| 5,729,466 A | | 3/1998 | Bamji ......................... 364/488 |
| 5,953,519 A | * | 9/1999 | Fura ............................ 716/18 |
| 6,026,228 A | * | 2/2000 | Imai et al. .................... 716/18 |
| 6,086,626 A | * | 7/2000 | Jain et al. ...................... 716/2 |
| 6,169,968 B1 | * | 1/2001 | Kabuo ......................... 703/14 |
| 6,199,031 B1 | * | 3/2001 | Challier et al. ............... 703/14 |
| 6,216,252 B1 | * | 4/2001 | Dangelo et al. ................ 716/1 |
| 6,301,687 B1 | * | 10/2001 | Jain et al. ...................... 716/3 |

OTHER PUBLICATIONS

Chatters et al, "An Experiment to Improve Cost Estimation and Project Tracking for Software and Systems Integration Projects" IEEE, Sep. 1999, pp. 177–184.*

Ray Madachy, "Knowledge–Based Risk Assessment and Cost Estimation" IEEE, Sep. 1994, pp. 172–178.*

Sentieys et al, "Hardware Module Selection for Real Time Pipeline Architectures using Probabilistic Cost Estimation" IEEE, Sep. 1996, pp. 147–150.*

* cited by examiner

Primary Examiner—Vuthe Siek
Assistant Examiner—Binh C Tat
(74) Attorney, Agent, or Firm—McDermott, Will & Emery

(57) ABSTRACT

A database includes: a virtual core (VC) cluster, on which data needed in designing various components of an integrated circuit device is separately stored at least on a specification VC and a register-transfer-level VC (RTL-VC); and implementability evaluation information stored on the specification VC. The information represents performance of the RTL-VC in accordance with a specification defined by the specification VC in the VC cluster. Specification VCs, corresponding to those components, are entered, and then the integrated circuit device being designed using the specification VCs entered has its implementability evaluated by reference to the implementability evaluation information stored on the specification VCs. In this manner, it is possible to determine, at a higher level of a design process, whether or not the respective VCs can meet the required performance easily. Thus, a needless, lengthy exploration of multiple architectural choices or a design deadlock, which usually results from overly rigorous requirements, is avoidable.

25 Claims, 15 Drawing Sheets

Fig. 5

| | |
|---|---|
| hierarchical level | : |
| design data (diagram) | : specification or architecture or RT layer |
| verification data | : test vector |
| implementability evaluation info. | : |
| performance info. | : area, delay, (power dissipation) |
| higher- or lower-level (correlated) layer info. | : higher-level VC of an order higher than VC in question<br>lower-level VC of an order lower than VC in question |
| derivative info. | : other VCs that belong to the same layer and were consulted when VC in question was generated |
| sharing info. | : information shared among VCs belonging to the same layer |
| contents of modifications | : addition or correction |
| interface | : ex. parallel or serial or PCI bus, ... |

|  | processing time | power dissipation |
|---|---|---|
| S1 | 50cycles | 100mW |
| S2 | 20cycles | 200mW |
| S3 | 40cycles | 100mW |

(all represented by AVE)

|  | processing time | time for inputting data | time for outputting data |
|---|---|---|---|
| S1 | 50cycles | 10cycles | 20cycles |
| S2 | 20cycles | 10cycles | 10cycles |

(all represented by MIN)

DATABASE FOR DESIGNING INTEGRATED CIRCUIT DEVICE, AND METHOD FOR DESIGNING INTEGRATED CIRCUIT DEVICE

BACKGROUND OF THE INVENTION

The present invention generally relates to a database for use in the design of an integrated circuit device and to a design process using such a database. More particularly, the present invention relates to methods of designing a very-large-scale integrated circuit device such as a system LSI even more efficiently.

In the prior art, an integrated circuit device is normally designed by generating blocks (or cores), which will be eventually replaced with actual components, through the specification design, architectural (or behavioral) design and register-transfer (RT) levels and then logically synthesizing these blocks together. These blocks are created through a top-down design approach, i.e., from the highest-order specification design level down to the lowermost RT level.

FIG. 16 is a flowchart illustrating the flow of a common design process of an LSI. At the specification design level, the designer defines a design specification empirically using some computer-aided design tool. At this early stage, it is not clear even for him or her whether or not the system will actually work in accordance with the specification defined. When this specification or architectural design is completed, tests (or simulations) are often carried out to see if the virtual system, made to the specification defined, will function properly just as intended. Once good test results are obtained, the system is further analyzed for its performance at the lowermost RT level. This analysis is usually carried out on a block-by-block basis. So if at least one of the building blocks of the system is found optimum, then the block is adopted. If there are no such blocks, however, the design process should return to the start of the loop to re-design an operable system over again. By repeatedly performing these process steps, the system being designed is refined little by little, and an optimum system can be constructed in the end.

According to this method, however, it would take an enormous amount of time to design a very-large-scale integrated circuit, like a system LSI, if the designer imposes overly rigorous requirements (i.e., specification excessively hard to realize) on the integrated circuit being designed at a higher level of the design process. This is because a system LSI includes a huge number of components that should be laid out in a very complicated manner. Thus, in the known process, the design loop should be reiterated too many times to complete the design process in a reasonable amount of time. Or in the worst-case scenario, the design process might sometimes reach a deadlock.

As is often the case, common designers are apt to overdesign, or expect highest possible performance at first, although so severe a specification is not actually needed. In fact, it is not until the lower-level design has reached a deadlock that the designers relax their requirements. Thus, those unrealistic performance requirements will constitute a great obstacle to the efficient design of a system LSI, which usually needs a huge workload even for the design of a single block.

SUMMARY OF THE INVENTION

It is therefore an object of the present invention to provide a database and design method that can avoid the needless, lengthy exploration of numerous architectural choices or the design deadlock by making those requirements as realistic as possible at the start of a design process.

A first inventive database stores thereon data needed in designing an integrated circuit device that will be made up of a plurality of components. The database includes: a virtual core (VC) cluster, on which the data needed in designing the components is separately stored at least on a specification VC and a register-transfer-level VC (RTL-VC); and implementability evaluation information stored on the specification VC. The information represents performance of the RTL-VC in accordance with a specification defined by the specification VC in the VC cluster.

According to the present invention, it is possible to provide a database, which is effectively applicable to determining, at the specification level (i.e., the highest level of a design process), whether or not the integrated circuit device will be able to meet the required performance easily.

In one embodiment of the present invention, the implementability evaluation information may contain data about at least one of processing time, layout area, power dissipation and test cost.

In another embodiment of the present invention, the implementability evaluation information may contain data about at least a processing time and a time needed for inputting or outputting data. In such an embodiment, the processing time, including a time needed for transferring data, can be used as a performance parameter for the implementability evaluation.

In still another embodiment, if there are multiple RTL-VCs associated with the specification, then the implementability evaluation information may contain the data as at least one of minimum, average, maximum and optimum values that are parameters representing the performance of each said RTL-VC.

In yet another embodiment, the first inventive database may further include workload estimation information stored on the specification VC. The information represents a workload needed for newly developing a VC in accordance with the specification and a workload needed for reusing the VC in accordance with the specification.

A second inventive database also stores thereon data needed in designing an integrated circuit device that will be made up of a plurality of components. The database includes: a virtual core (VC) cluster, on which the data needed in designing the components is separately stored at least on a specification VC and a register-transfer-level VC (RTL-VC); and workload estimation information stored on the specification VC. The information represents a workload needed for newly developing a VC in accordance with the specification defined by the specification VC and a workload needed for reusing the VC in accordance with the specification.

According to the present invention, a workload needed for a design process can be estimated with certain accuracy at the highest level of the design process. Thus, the number of designers needed, for example, can be known in advance by taking the estimated workload and the due date into account.

In the first or second inventive database, the specification VC may be combined with an architecture VC to form a single specification/architecture VC.

An inventive method is adapted to design an integrated circuit device, which will be made up of a plurality of components, using a database. The database includes: a virtual core (VC) cluster, on which the data needed in designing the components is separately stored at least on a specification VC and a register-transfer-level VC (RTL-VC); and implementability evaluation information stored on the specification VC. The information represents performance of the RTL-VC in accordance with a specification defined by the specification VC. The method includes the steps of: a) entering the specification VCs corresponding to the respective components; and b) evaluating the implementability of the integrated circuit device being designed using the specification VCs entered in accordance with the implementability evaluation information stored on the specification VCs.

According to the inventive method, it is possible to expect, at the highest level of a design process of an integrated circuit device, whether or not the respective VCs will be able to meet the required performance easily. Thus, the needless, lengthy exploration of architectural alternatives or the design deadlock, which usually results from the overly rigorous requirements, is avoidable. As a result, even a very-large-scale integrated circuit device can be designed easily.

In one embodiment of the present invention, the implementability evaluation information may contain data about at least one of processing time, layout area, power dissipation and test cost. In that case, the step b) is preferably performed with at least one of the processing time, layout area, power dissipation and test cost used as a parameter.

In another embodiment of the present invention, the implementability evaluation information may contain data about at least a processing time and a time needed for inputting or outputting data. In that case, the step b) is preferably performed with a time needed for transferring data and the processing time used as parameters.

In still another embodiment, the implementability evaluation information may contain the data as at least one of minimum, average, maximum and optimum values that are parameters representing the performance of each said RTL-VC. In that case, the step b) is preferably performed based on at least one of the minimum, average, maximum and optimum values of the parameters.

In yet another embodiment, the step b) may be performed by comparing a required value of the performance of the VCs to an estimated value of the performance. The estimated value is derived from the implementability evaluation information stored on the specification VCs.

In this particular embodiment, the step b) is preferably performed with the estimated performance value of the VCs evaluated by percentage on the supposition that the required performance value is 100%. In this manner, the implementability can be evaluated based on not only the designer's experience but also some objective criteria.

In an alternative embodiment, the step b) may also be performed with one of the VCs that has the lowest implementability extracted as a bottleneck as for a performance. In this manner, VCs to be newly developed and VCs that should have their requirements relaxed can be known clearly. Thus, the re-design process can be carried out smoothly at the highest level.

In still another embodiment, in the step b), reusable ones of the components may be provided with the performance of the RTL-VCs, corresponding to the components, in the VC cluster, while the other components may be provided with the performance defined by the implementability evaluation information stored on the specification VCs, corresponding to the components, in the VC cluster. In this manner, the implementability can be evaluated very easily.

In yet another embodiment, if a function model with exemplary design realizations is reused and part of the components of the model are changed to make a modified function model, then reusable ones of the components are provided in the step b) with the performance of the RTL-VCs in the VC cluster that has been applied to the exemplary design realizations. In this manner, the implementability can also be evaluated very easily.

In yet another embodiment, the method may further include the step of dividing the required performance value into multiple values, which have been weighted for the respective VCs corresponding to the components, after the step b) has been performed. In such an embodiment, the performance to be attained by each VC at the lowest level of a design process can be clarified and therefore the lowest-level design process can be carried out more quickly.

In yet another embodiment, the method may further include the step of equally dividing the required performance value for the respective VCs corresponding to the components after the step b) has been performed.

In yet another embodiment, workload estimation information may be further stored on the specification VCs of the database. The information represents a workload needed for newly developing a VC in accordance with the specification and a workload needed for reusing the VC in accordance with the specification. In that case, the method may further include the step of estimating a workload needed for each said component by reference to the workload estimation information stored on the specification VCs corresponding to the respective components after the step of dividing has been performed. In this manner, the due date of a design process, for example, can be managed smoothly.

In still another embodiment, the method may further include the step of dividing the required performance value for the respective VCs between the steps a) and b). In that case, the step b) may be performed by determining, in accordance with the implementability evaluation information stored on the specification VCs corresponding to the respective components, whether or not realizations, meeting the divided performance values, account for a predetermined percentage or more.

In yet another embodiment, the required performance value may be divided into multiple values weighted for the respective VCs.

Alternatively, the required performance value may be equally divided for the respective VCs.

In this particular embodiment, the step b) may also be performed with one of the VCs that has the lowest implementability extracted as a bottleneck as for a performance.

In yet another embodiment, workload estimation information may be further stored on the specification VCs of the database. The information represents a workload needed for newly developing a VC in accordance with the specification and a workload needed for reusing the VC in accordance with the specification. In that case, the method may further include the step of estimating a workload needed for each said component by reference to the workload estimation information, stored on the specification VCs corresponding to the respective components, after the step b) has been performed.

BRIEF DESCRIPTION OF THE DRAWINGS

FIG. 5 illustrates the structure of each VC according to the present invention.

DESCRIPTION OF THE PREFERRED EMBODIMENTS

First, the general construction of a virtual core design system (VCDS), which is applicable to the preferred embodiments of the present invention, will be described.

What is VC?

The "virtual core (VC)" according to the present invention is a concept definitely different from the "virtual component", which is often regarded as synonymous with the "intellectual property (IP)" or "functional block". Unlike the virtual component, the virtual cores are defined to design a system LSI as a single integral block. Also, the virtual cores stand for a collection of data about reusable hardware and software. The "virtual core design system (VCDS)" according to the present invention refers to an overall system adapted to optimize the hardware and software indispensable for a desired system LSI by using the VCs. The "virtual core database (VCDB)" means a database for use in the VC-based design.

Schematic Construction of VCDS

Figure 1:
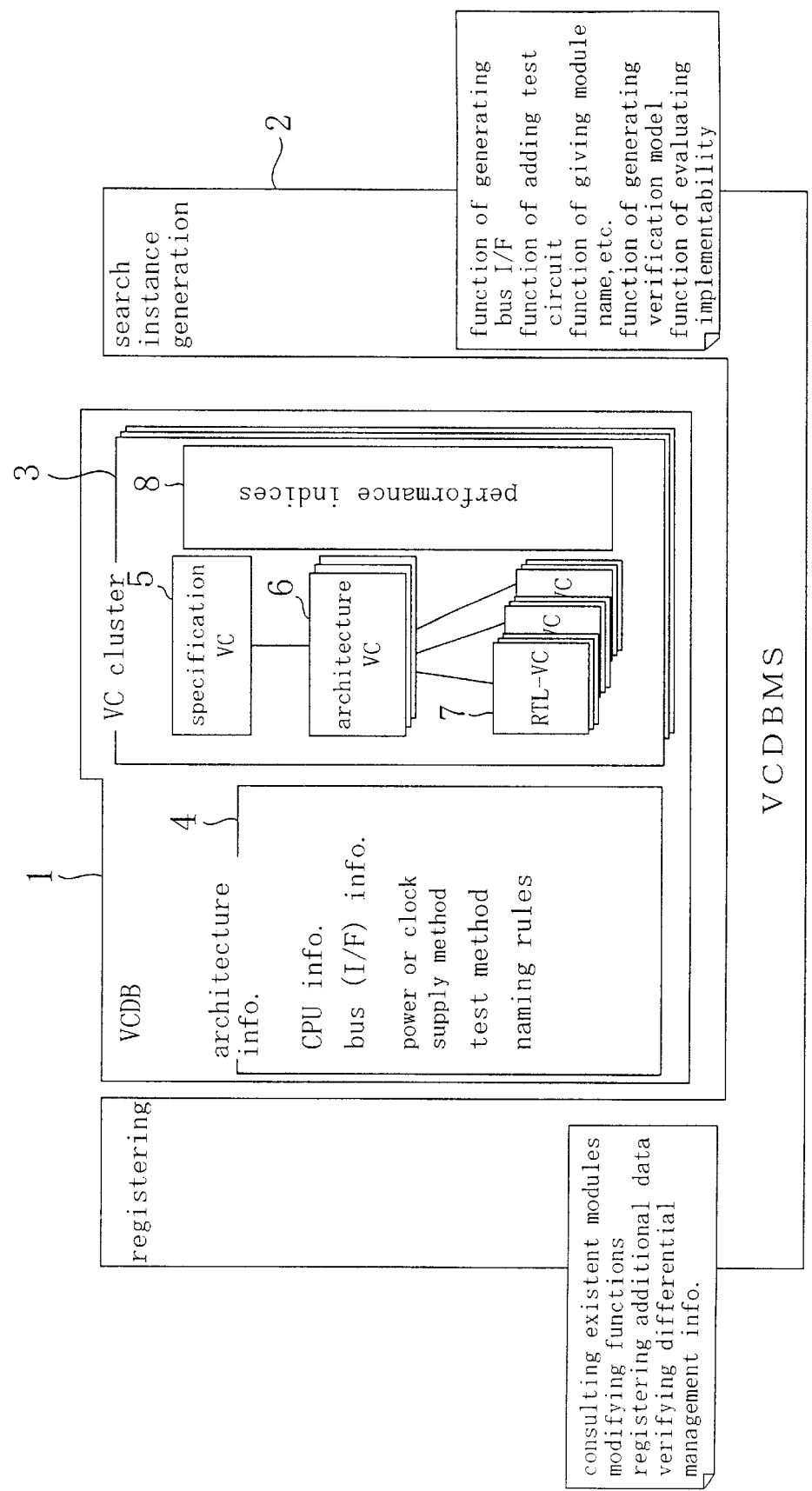
FIG. 1 illustrates a schematic construction of a virtual core design system (VCDS) used for designing a system LSI according to the present invention.

FIG. 1 illustrates a schematic construction of the VCDS used for designing a system LSI according to the present invention.

As shown in FIG. 1, the VCDS is made up of: a VCDB 1, which is implementable as hierarchical data storage for storing thereon data needed in designing a system; and a virtual core database management system (VCDBMS) 2, which is a control system for optimizing the VCDB 1.

The VCDB 1 includes: a VC cluster 3, which is a collection of virtual cores; and architecture information 4, which is used to determine the VC architecture of the VC cluster 3. The VC cluster 3 includes specification VC 5, architecture VCs 6, register-transfer-level (RTL) VCs 7 and performance indices 8. The specification VC 5 is a virtual core for storing thereon data described at the specification level. The architecture VCs 6 are virtual cores for storing thereon data described at the architectural level. The RTL-VCs 7 are virtual cores for storing thereon data described at the register transfer level. And the performance indices 8 are used for evaluating the performance of each VC.

As used herein, the "specification" defines basic input/output relations as "functions" so to speak. The "architecture" defines the allocation of software and hardware for a single specification. Generally speaking, various types of architecture are associated with a single specification. The "register transfer" defines hardware-implementable architecture. In general, several different types of implementations are imaginable for a single type of architecture, because the architecture is implementable with mutually different sets of parameters respected. That is to say, as will be detailed later, the VC cluster 3 usually has a hierarchical structure, in which each specification VC 5 is associated with a plurality of architecture VCs 6 and each of these architecture VCs 6 is further linked to a plurality of RTL-VCs 7. It should be noted, however, that both the "specification" and "architecture" could be regarded as representing functional concepts. Accordingly, it is sometimes difficult to distinguish these two concepts clearly. In such a case, the specification VC and architecture VCs may be combined together as a specification/architecture VC for a database.

Examples of the performance indices 8 include parameters such as area and speed. At the RT level, for example, the performance can be estimated as a rather accurate value. Also, if a system LSI has ever been implemented at the RT level by means of hardware, then the results may also be incorporated into the performance indices 8.

The architecture information 4 includes information indicating how the respective VCs should be used for the system LSI in practice. For example, when a task should be implemented by means of software, the architecture information 4 tells us which processor and bus (or interface) should be used to execute the task, how power and clock pulses should be supplied, what type of test should be carried out during the logic synthesis and what types of constraints will be imposed in naming (i.e., what types of tools should be used to avoid duplications).

On the other hand, the VCDBMS 2 is used for registering new VCs with the VCDB 1, searching the VCDB 1 externally and generating instances. The registering process includes not only registering a brand new core, but also generating a new VC by consulting existent VCs and modifying the functions of the VCs, registering additional data items with the VCs, and storing differential management information thereon. As used herein, the "search" means searching VCs at a particular level for a specific type of information. For further details, see the following description.

Figure 2:
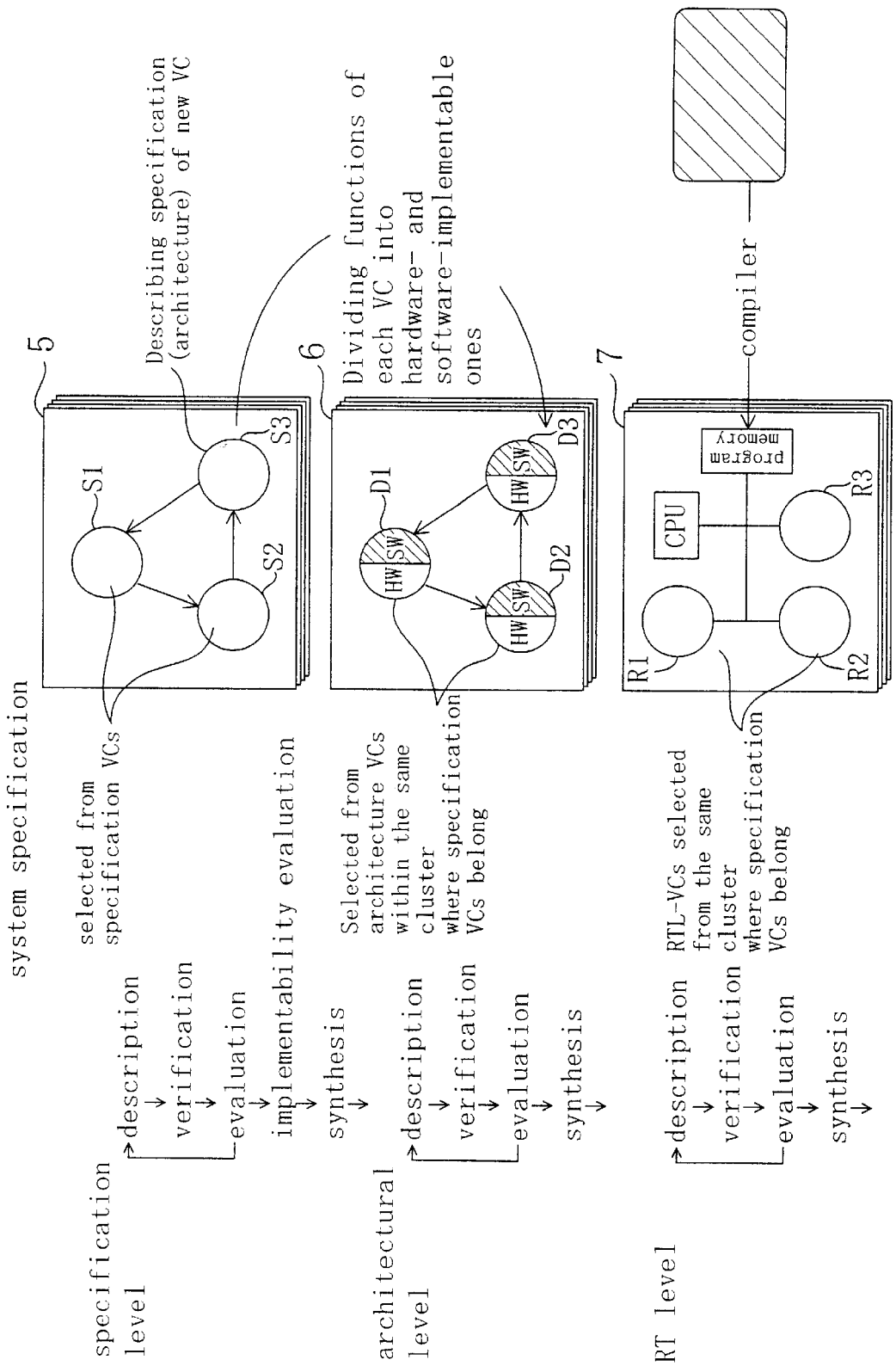
FIG. 2 illustrates a basic flow of a design process in the VCDS according to the present invention.

FIG. 2 illustrates a basic flow of the design process in the VCDS according to the present invention. As shown in FIG.

2, VCs are generated or modified following the processing steps of description, verification, evaluation and synthesis at each of the specification, architectural and RT levels. In this case, the data flows in the direction as indicated by the arrows in FIG. 2, thereby describing, verifying and evaluating the data. Then, the evaluative results are fed back. For example, at the specification level, specification VCs S1 and S2 may be chosen or a new VC S3 may be generated. At the architectural level, architecture VCs D1, D2 and D3, corresponding to the specification VCs S1, S2 and S3, respectively, are generated. On this level, each of these VCs is divided into two sections, which are associated with hardware and software implementations, respectively, considering the intended functions thereof. At the RT level, not only RTL-VCs R1, R2 and R3, corresponding to the architecture VCs D1, D2 and D3, respectively, but also a bus, interconnecting these VCs, CPU, memory and so on, are generated. That is to say, a more specific implementation is defined at this RT level.

Also, as shown in FIG. 2, the implementability of the specification is evaluated at the specification level and the evaluative results are also fed back. The prime feature of the present invention consists in this implementability evaluation, which will be described in further detail later.

Each of these tasks may be described as a state transition from a specification VC or an external input/output section. The specification VC is described in a language or as graphics representing state transition, logic and truth table.

By placing VCs at respective levels and managing these VCs collectively in this manner, a flexibly usable database, which is definitely different from a conventional functional block, can be provided.

Construction of VC Cluster

Figure 3:
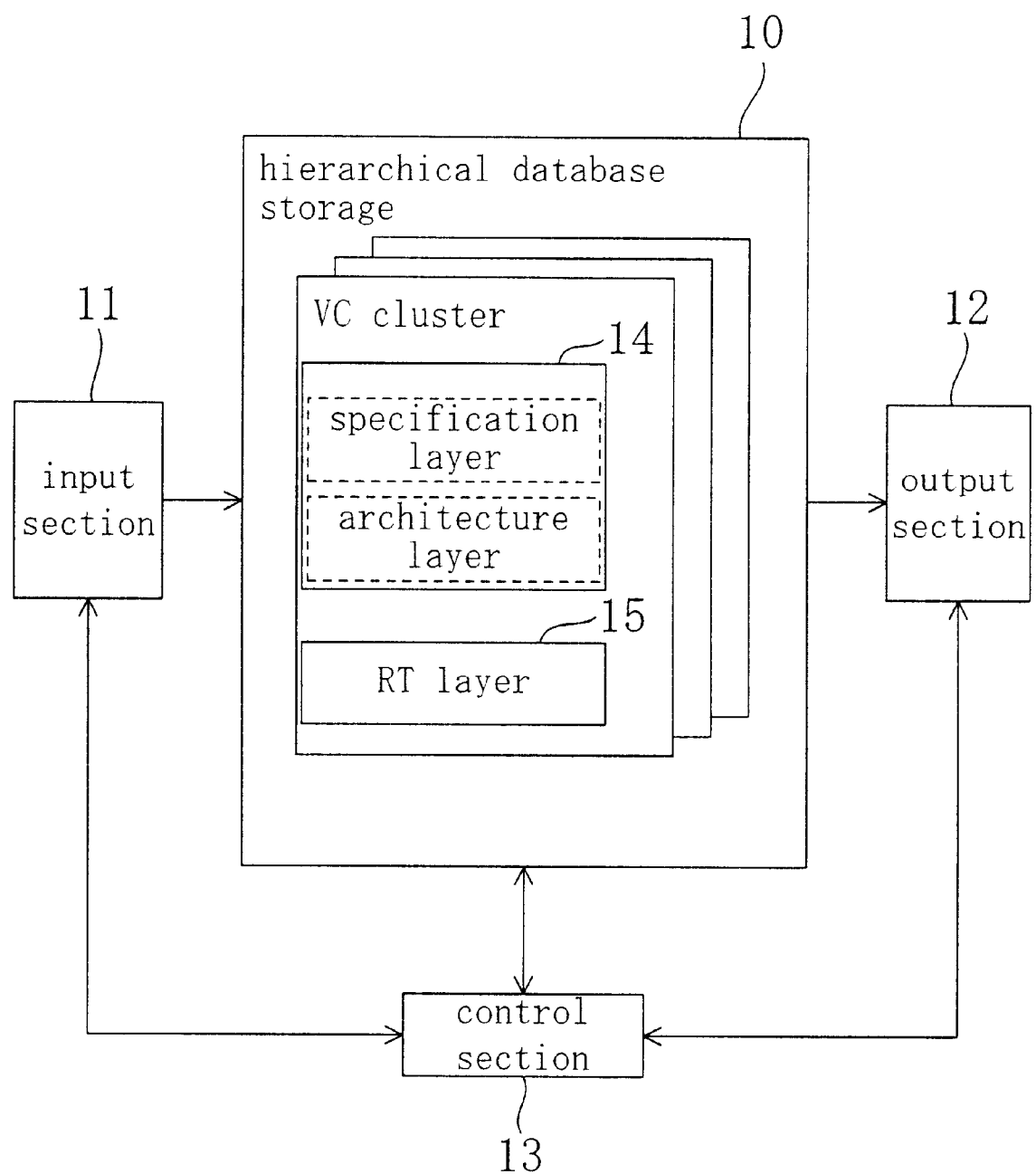
FIG. 3 is a block diagram illustrating the functional portions extracted from the system shown in FIG. 1.

FIG. 3 is a block diagram illustrating the functional portions extracted from the system shown in FIG. 1. As shown in FIG. 3, an input section 11 inputs information to hierarchical database storage 10, on which the VC clusters 3 are stored. An output section 12 receives the information output from the hierarchical database storage 10. And a control section 13 controls the hierarchical database storage 10, input section 11 and output section 12. In each of these VC clusters 3, the functions represented by a specification layer for generating specification VCs, an architecture layer for generating architecture VCs and an RT layer 15 for generating RTL-VCs exist. Since the specification and architecture layers cannot always be clearly distinguished from each other, a combined specification/architecture layer 14 is illustrated in FIG. 3.

Figure 4:
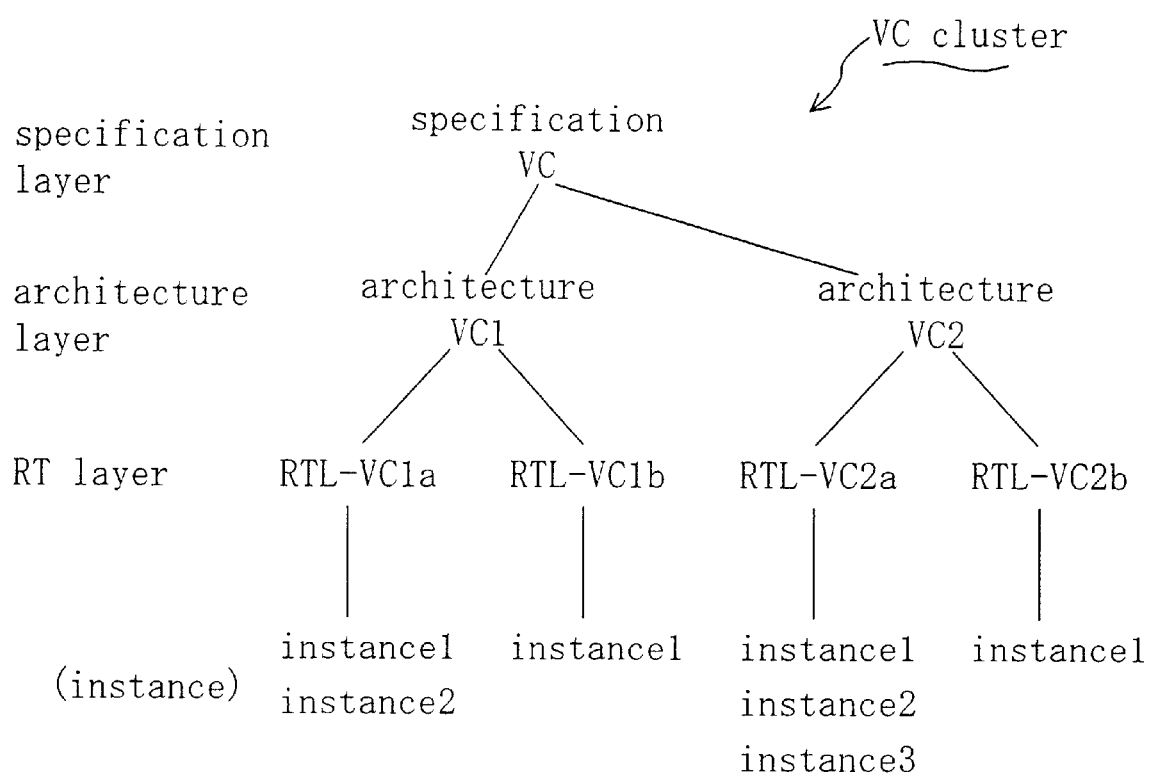
FIG. 4 illustrates in detail the functions of a VC cluster.

FIG. 4 illustrates the functions of a VC cluster in detail. As shown in FIG. 4, when a specification VC, representing a certain function, exists in the specification layer, a plurality of architecture VCs 1 and 2 usually exist to implement the function in the next-highest-level architecture layer. And in the RT layer at the next level, a pair of RTL-VCs 1*a* and 1*b* exists to implement the architecture VC 1 and another pair of RTL-VCs 2*a* and 2*b* exists to implement the architecture VC 2. For example, a single specification "multiplication" corresponds to various combinations of additions and shifts. Thus, multiple architectures usually exist correspondingly. Nevertheless, just one VC may exist at a lower level. In the example illustrated in FIG. 4, the single specification VC "multiplication" is associated with not only the architecture VC 1, which is an implementation respecting delay, but also the architecture VC 2, which is an implementation respecting (occupied) area. Each of these layers has a function of generating and adding instance VCs. In the example illustrated in FIG. 4, each of the RTL-VCs 1*a*, 1*b*, 2*a* and 2*b* has a function of generating one or more instance VCs.

FIG. 5 illustrates the structure of each VC according to the present invention. Each VC belonging to the specification, architecture or RT layer includes: design data (diagram) to be described later; verification data such as test vectors; performance information about area, delay (and power dissipation); higher- or lower-level (correlated) layer information, which is link information about VCs of respective orders higher or lower than the VC in question; derivative information about other VCs that belong to the same layer or were consulted when the VC in question was generated or other VCs consulted; information shared among VCs belonging to the same layer (e.g., the architecture layer); contents of modifications if new items were added to the VC or if the VC was corrected; and interface information used for generating parallel, serial or PCI buses. The specification layer further includes implementability evaluation information.

Figure 6:
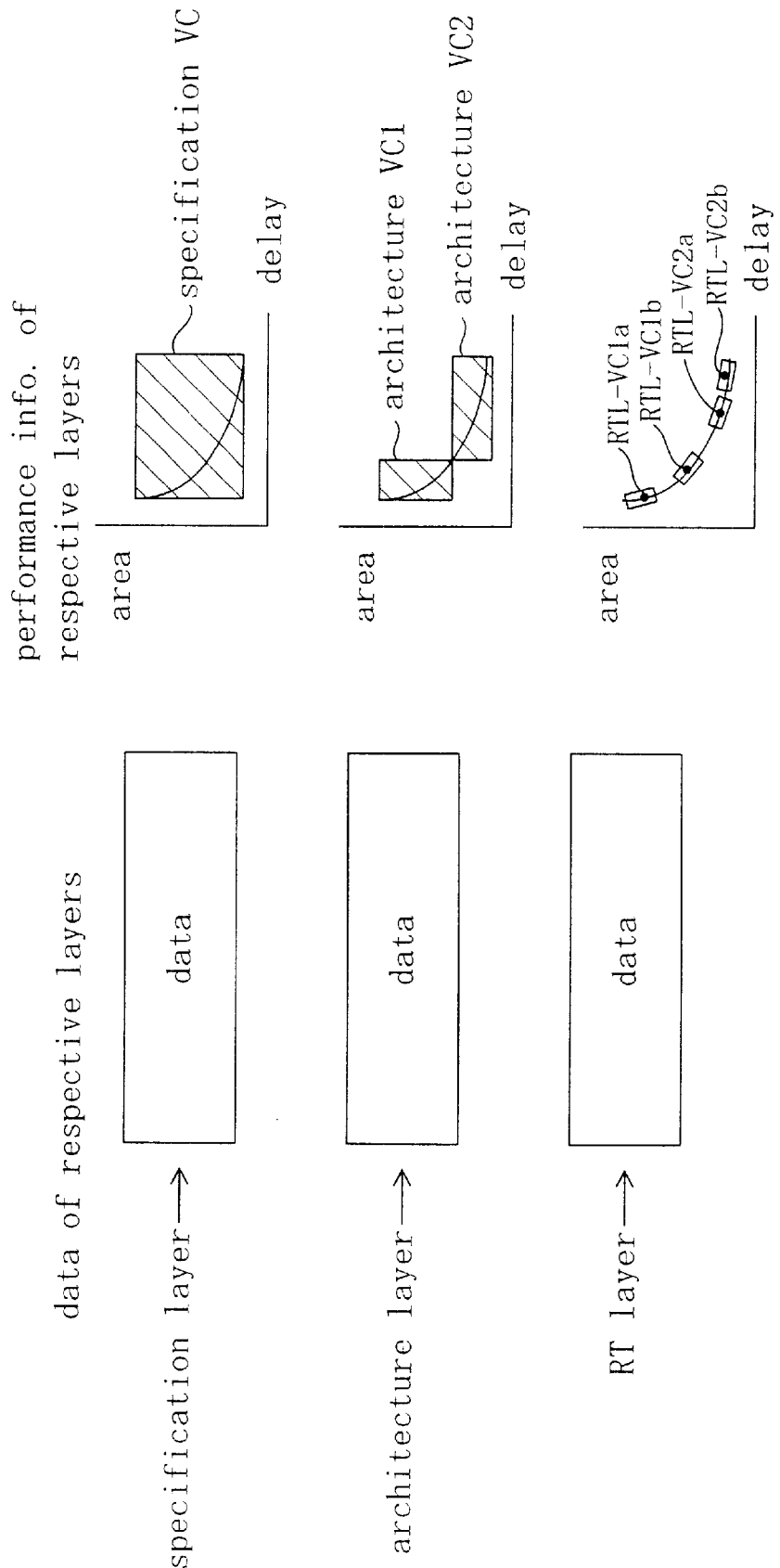
FIG. 6 illustrates relationships between VC data and performance information at respective design levels according to the present invention.

FIG. 6 illustrates relationships between data and performance information about VCs at respective layers of a design process. On the right-hand side of FIG. 6, exemplary performance information about the respective layers is illustrated using the (occupied) area and delay as performance evaluation parameters. On the left-hand side of FIG. 6, the design data and verification data about respective layers exist, but the details thereof are omitted from FIG. 6 for the sake of simplicity.

The specification layer defines basic input/output relations, which may be called "functions". Thus, the design data stored on the specification layer includes: the types of input/output signals; text-based data; various standards such as protocols; performance, e.g., target performance to accomplish in compliance with a certain standard; and a function specification provided as a document. Specification descriptions (in the form of a language or graphics), represented as finite state machine (FSM), control flow graph (CFG) or data flow graph (DFG), are provided as specification verification models. Examples of specific formats include VHDL, SDL, LOTOS and C/C++.

The architecture layer includes architecture information, hardware section and software section. The architecture information includes the name of the target processor, name of the operating system (OS) and communication methods between hardware and software. For example, if processor, OS and simulation are combined, the name of the target processor may be Sparc, Pentium, etc., the name of the OS may be UNIX, Windows, etc., and the hardware/software communication method adopted may be interprocess communication (IPC), programming language interface (PLI), etc. As the architecture information, not only appropriate combinations such as these, but also appropriate prerequisites are described. The CPUs may sometimes be omitted. In the hardware section, specific realizations of functions based on the information stored on the specification layer are stored as documents. More particularly, detailed operation modes, which are not defined by the specification, are described in this section.

Like the architecture layer, the RT layer also includes architecture information and hardware and software sections. However, a bus, interconnecting the hardware (HW) section, CPU, memory (MEM), software (SW) section and OS together, has already been defined in the RT layer. That is to say, the communication method has also been specified to such a level as indicating particular paths. Thus, in accordance with the information stored on the RT layer, hardware implementation, or logic synthesis, is readily realizable.

The architecture information stored on the RT layer includes the following information. Firstly, cooperative verification models applicable to the architecture and RT layers are stored as processor (CPU) information. These models are associated with respective processors. Secondly, information about a signal on a bus, e.g., its type, width and so on, and the bus protocol (timing) are stored as bus (I/F) information. Information needed in interconnecting the processor to respective hardware components is contained in this information.

Suppose the specification VC shown in FIG. 4 exists in the specification layer. In such a case, the performance of the specification VC may be represented, using the area and delay as parameters, like the hatched range on the upper-right graph in FIG. 6. The specification VC is associated with the architecture VC 1, which is an implementation respecting delay, and the architecture VC 2, which is an implementation respecting area, as shown in FIG. 4. As represented by the middle graph shown in FIG. 6, the range of the architecture VC 1 is a hatched region with a relatively short delay, while the range of the architecture VC 2 is a hatched region with a relatively small area. Also, as shown in FIG. 4, the architecture VC 1 is associated with the RTL-VCs 1a and 1b, while the architecture VC 2 is associated with the RTL-VCs 2a and 2b. As represented by the lower-right graph in FIG. 6, a combination of area and delay of each of these RTL-VCs is defined as an associated point on the curve.

The performance information includes a large number of parameters. Thus, the performance information about each layer is actually represented as a multi-dimensional coordinate system, not the planar coordinate system shown in FIG. 6. In fact, the performance information about the RT layer is represented as a range or a point within a multi-dimensional space, while the performance information about the specification or architecture layer is represented as a range within the multidimensional space.

As described above, an object of the present invention is to make the specification, defined at the start of a design process, as feasible as possible or to define even more realistic requirements when the overall system is partitioned into various functions that will be realized by respective components. That is to say, if the specification, defined at the initial stage of the design process, is appropriate enough, then the design process will neither be inefficient nor reach any deadlock, since overly rigorous requirements are not imposed in that case. More specifically, according to the present invention, the specification is defined adaptively for respective parts of a target system, because some parts of the system require severe specification but others don't. Hereinafter, a specific method for accomplishing this object will be described.

Embodiment 1

Design Process Including Implementability Evaluation at Specification Layer

Figure 7:
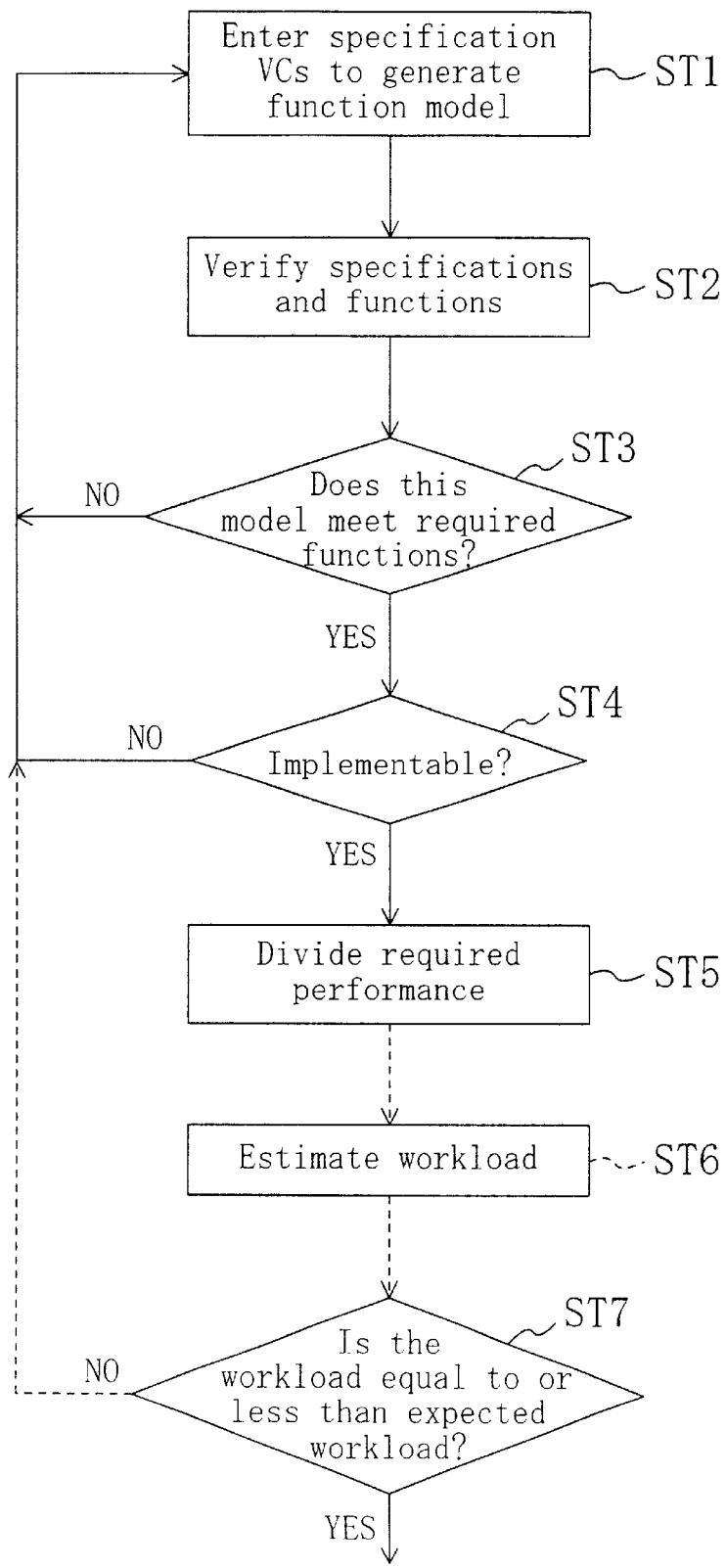
FIG. 7 is a flowchart illustrating respective design process steps, which include implementability evaluation, at a specification layer according to a first embodiment of the present invention.

Next, an inventive method for designing a system LSI using the VCDS at the specification layer will be described. FIG. 7 is a flowchart illustrating respective design process steps, which include the implementability evaluation, at the specification layer.

First, in Step ST1, specification VCs are entered from a database and models, corresponding to the specifications defined, are combined with each other, thereby developing (or generating) a model that would meet the specifications required by the system LSI. This model will be herein called a "function model". Examples of those function models include a function model for an LSI applicable to a digital still camera as will be described later with reference to FIG. 9. That is to say, this process step ST1 include entering the specification VCs from the VCDB, placing these VCs and defining the dependence indicating what types of data should be exchanged among these VCs to generate a function model for the overall system.

Next, in Step ST2, specification/function verifications are carried out, i.e., simulations are performed to analyze the functionality of the function model generated in Step ST1. Then, in Step ST3, it is determined whether or not this function model works as expected to meet the required functions. It should be noted, however, that the specifications and functions at this point in time are nothing but qualitative ones, not quantitative ones like the "performance" to be evaluated later. Also, these process steps ST2 and ST3 may be carried out after Step ST4 has been performed.

Once it has been confirmed that a function model, meeting the required functions, has been generated, it is determined in Step ST4 whether or not the system is implementable. More specifically, the implementability of the system (or the feasibility of the system concept) is evaluated based on the performance and costs required by the system LSI (e.g., processing time, throughput, power dissipation, layout area and test costs). That is to say, if any of the VCs (design realizations) prepared can meet all of these requirements, then the system may be regarded as implementable. In this case, it is determined using some indices (to be described later) whether or not those requirements on the system are easily realizable. If none of the VCs prepared meets the requirements, then the process returns to Step ST1, in which VCs meeting the requirements are newly generated or the requirements are relaxed without generating any new VCs. And then Steps ST2 through ST4 will be repeatedly performed until all of the requirements are satisfied optionally, the implementability may also be evaluated depending on whether or not VCs meeting the requirements can be generated easily.

By repeatedly performing Steps ST1 through ST4 in this manner, a system, which is deemed implementable at this time, is obtained.

If the answer to the query of the decision step ST4 is YES, then the process advances to Step ST5 of dividing a given performance requirement (including costs) for respective VCs to realize the performance expected of the system. Then, the rest of the design process will be performed in such a manner as to generate VCs meeting the performance values obtained in this step ST5. Specific examples of this process step ST5 will be described later.

If all of existent VCs may be reused, then the total workload will be relatively small. On the other hand, if some additional VCs should be generated, the total workload will be relatively large. Thus, optionally, Steps ST6 and ST7 may be performed. Specifically, in Step ST6, the total workload needed is estimated provisionally based on the number of VCs to be newly generated. Then, in Step ST7, it is determined whether or not the estimated workload is equal to or less than an expected workload. And if the answer is NO, then the process may return to Step ST1. In this manner, the specifications may sometimes be refined depending on the estimated workload needed.

Hereinafter, the features of the present invention will be described in further detail in accordance with the flow illustrated in FIG. 7.

Structure of Database

Figure 8:
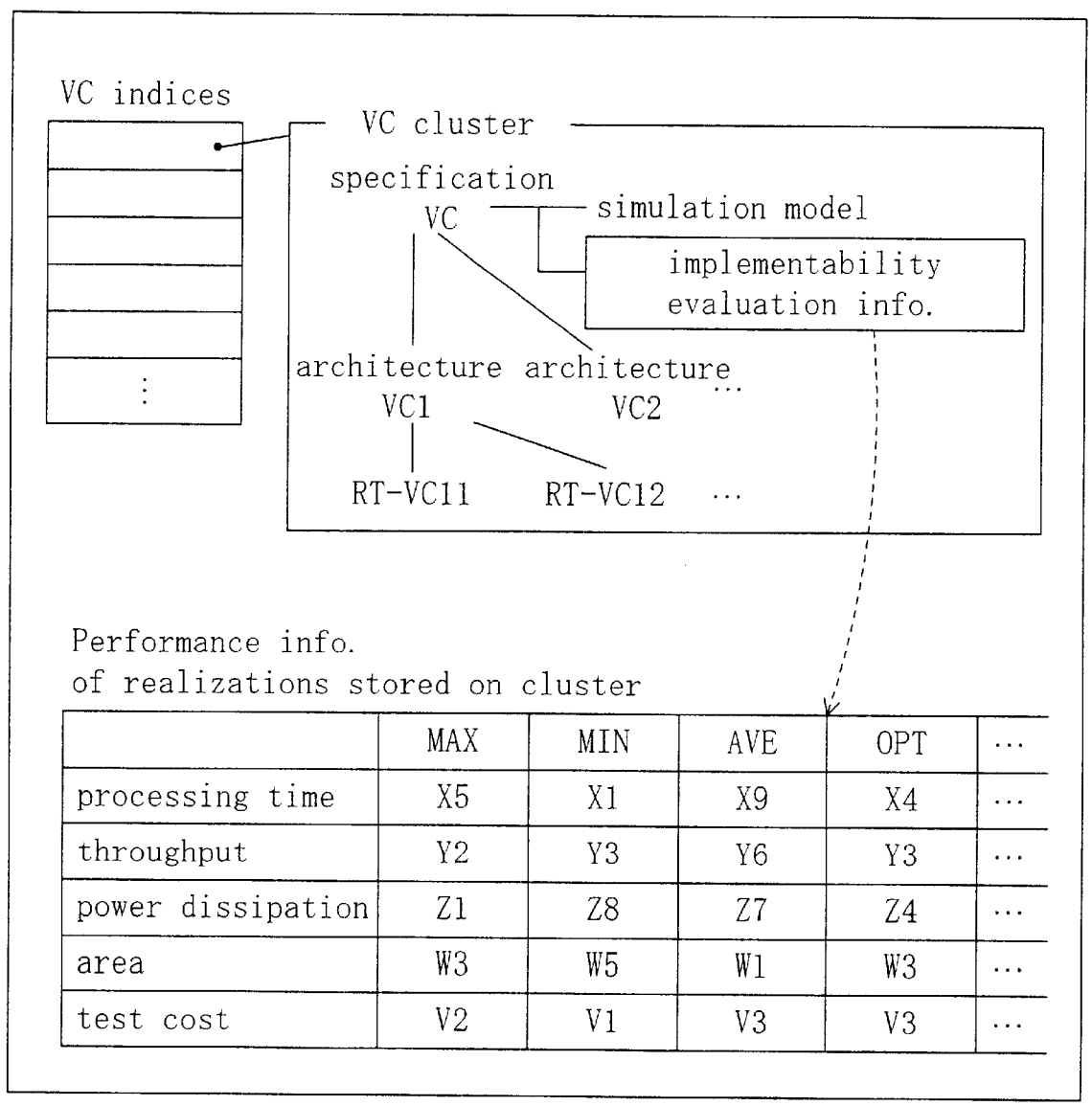
FIG. 8 illustrates the characteristic parts of the database according to the first embodiment.

FIG. 8 illustrates the characteristic parts of the database according to the present invention. A specification VC has parts defining pure functions and input/output relations and also has simulation models used to check those functions and relations, i.e., see if these functions are actually implementable. In the illustrated embodiment, the specification VC further includes implementability evaluation information, which is performance information prepared for various exemplary implementations stored on the cluster. On the specification VC, data about exemplary implementations of architecture VCs and RTL-VCs, corresponding to the specification defined by the specification VC, is stored. However, if the specification and architecture layers are combined to form a single specification/architecture layer in the VC cluster, then the implementability evaluation information will be stored on the specification/architecture layer.

The performance information about the implementations stored on the cluster includes the maximum, minimum, average and optimum values MAX, MIN, AVE and OPT of processing time, throughput, power dissipation, (layout) area and test cost involved with the exemplary implementations of RTL-VCs as shown in the table in FIG. 8. In this case, the optimum values OPT are selected while taking tradeoffs necessary for respective performance indices (or parameters) into account. For example, a tradeoff is inevitable among the layout area, processing time and power dissipation. Accordingly, these parameters can be optimized when the product thereof is minimized. That is to say, in this case, a combination of layout area, processing time and power dissipation can be regarded as conisting of their optimum values OPT if the product of these three parameters is minimum.

Function Model

Figure 9:
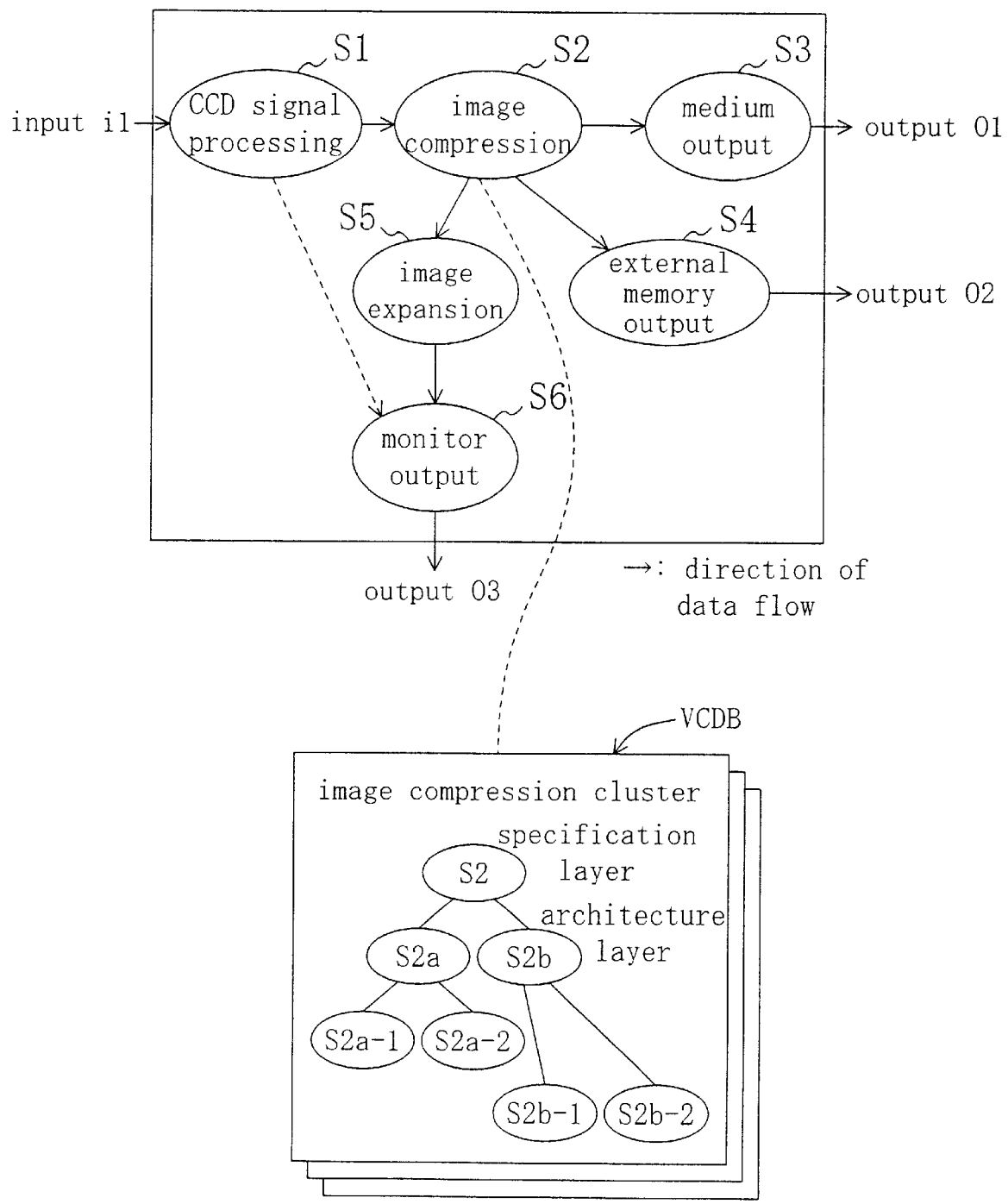
FIG. 9 is a block diagram illustrating an exemplary function model for an LSI applicable to a digital still camera.

FIG. 9 is a block diagram illustrating an exemplary function model for an LSI applicable to a digital still camera. In the example illustrated in FIG. 9, six VCs S1 through S6 have been generated. S1 is a CCD signal processing VC corresponding to a component for receiving and processing a CCD input signal i1. S2 is an image compression VC corresponding to a component for compressing an image produced from the CCD signal. S3 is a medium output VC for outputting the compressed image data as output O1 to a medium. S4 is an external memory output VC for outputting the compressed image data as output O2 to an external memory. S5 is an image expansion VC corresponding to a component for expanding the compressed image data. And S6 is a monitor output VC corresponding to a component for outputting the expanded image data as output O3 to a monitor. As described above, VC clusters, each storing the data associated with the specification, architecture and RT layers thereon, have been registered with the database VCDB. On the bottom of FIG. 9, an exemplary structure for the image compression VC cluster is illustrated.

Parameters Representing Performance for use in Implementability Evaluation

The implementability is evaluated in the following manner as a matter of principle. Specifically, the requirements on a target system are compared to the performance values, which are derived from the implementability evaluation information stored on the specification VC in the VC cluster entered. And if all of the requirements fall within the possible ranges of the performance values, then the implementability is affirmed. Examples of those parameters representing the performance include the processing time, throughput, layout area, power dissipation and test cost. As used herein, the "performance" is defined as a concept comprising the cost.

Also, in the illustrated embodiment, the implementability is evaluated by setting most of those parameters, representing the performance, in such a manner that the smaller the parameters, the more advantageous for the resultant integrated circuit device. For example, data processing rate and processing time are parameters that are inversely proportional to each other, because the product of these two parameters represents a quantity of data processed. The higher the processing rate, the more advantageous for the integrated circuit device. Conversely, the shorter the processing time, the more advantageous for the integrated circuit device. Accordingly, in this case, the processing time is regarded as one of the parameters for use in the implementability evaluation.

It is naturally possible to use the processing rate as one of the parameters. In that case, however, the greater the difference between the performance value derived from the VC and the requirement, the more easily implementable the integrated circuit device.

In the implementability evaluation information stored on the VC cluster of the database, the maximum, average, minimum and optimum values MAX, AVE, MIN and OPT of the performance realized by the RTL-VCs are described. The implementability may be evaluated by using any of the maximum, average, minimum and optimum values MAX, AVE, MIN and OPT. In adding together the performance values of multiple VCs, however, all of the performance values should be the maximum, average, minimum or optimum values MAX, AVE, MIN or OPT. As for a parameter that should be as small as possible, the use of the maximum performance value MAX thereof is not preferable because the implementability is evaluated with too much margin. In that case, even if the system is implementable using the minimum performance value MIN, the system might be erroneously evaluated as being non-implementable. Accordingly, in such a situation, the minimum, average or optimum MIN, AVE or OPT should preferably be used instead. On the other hand, as for a parameter that should be as large as possible (e.g., throughput), the maximum, average or optimum MAX, AVE or OPT is preferably used.

In the following description, parameters, which should preferably be as small as possible, are supposed to be used. In this case, if the implementability is evaluated using the minimum values MIN, then the performance will be ensured for at least one of the parameters. However, if the tradeoff that is inevitable among that parameter and the others is taken into account, the implementability cannot always be ensured for all of these parameters. In other words, the implementability in the strictest sense of the word is evaluated in such a case. On the other hand, if the implementability is evaluated using the average values AVE, then the implementability can be evaluated with some margin while taking the tradeoff among the parameters into account. Nevertheless, even implementable systems might be eliminated in that case. At this stage, the implementability evaluation does not have to be so strict as the performance evaluation at the RT level, but just needs to be numerically correct to a certain degree. Accordingly, whether the minimum values or the average values are adopted, evaluation should not be performed to find exact match between the required values and the performance values of the VC, but some correction should be made in advance.

Making Index to Implementability

Next, it will be described how a numerical index to the implementability may be used to quickly evaluate the degree of implementability.

In the illustrated embodiment, indexing each required performance value as 100%, the implementability is evaluated by the percentage of the total performance value described in the implementability evaluation information of each specifica=tion VC entered.

For example, the implementability may be evaluated using, as an index, the total processing time needed for a path connecting the three VCs S1, S2 and S3 in series together in the system shown in FIG. 9. Suppose the required processing time (not including the transfer time) is 90 cycles, while the minimum processing times MIN, known from the implementability evaluation information stored on the VC clusters for the VCs S1, S2 and S3, are 50, 10 and 10 cycles, respectively. Then, the percentage of the total processing time to the required processing time is:

$$100\times\{(50+10+10)/90\}=100\times\{70/90\}=67\%$$

Since the minimum values of the processing times are adopted in this case, a certain margin should be added in advance. If the margin is 20%, for example, then the total percentage, i.e., the sum of the above percentage (67%) and the margin (20%), will be 87%, which is herein used as an index to the implementability. Since the total percentage is less than 100% in this case, the implementability is affirmed (i.e., the path is regarded as implementable). This marginal percentage is specified for each product being designed. Also, the information about margins obtained in the past may be associated with the information about the specification VCs to compile a database.

To sum up, according to the present invention, performance parameters, which should preferably be as small as possible, are adopted for the implementability evaluation. And if the sum of a minimum performance value of the VC cluster entered and a predetermined margin is less than 100% of the required performance value, the implementability is affirmed.

By making the numerical index (i.e., 100%) to the implementability in this manner, the designers can learn the range where the system will be implementable easily. Accordingly, the designer can set an appropriate margin for the system by percentage.

It should be noted, however, that this index does not always have to be used in evaluating the implementability. Also, as described above, another index to the implementability may be made using the average values AVE retrieved from the implementability evaluation information stored on the VC cluster.

Figure 10:
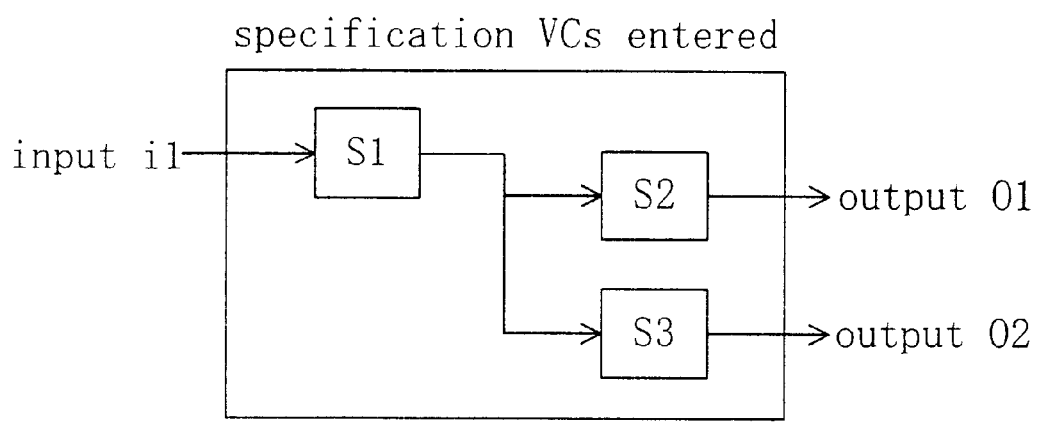
FIG. 10 is a block diagram of a system illustrating how implementability may be evaluated using processing time and power dissipation as parameters according to the first embodiment.

How to Evaluate Implementability using Processing Time and Power Dissipation as Parameters Suppose a system illustrated in FIG. 10. In this system, after an input i1 has been processed by a VC S1, the processed input is distributed to, and processed by, two VCs S2 and S3, thereby providing output data O1 and O2 to an external system. Although the processing is actually performed by respective components associated with these VCs S1, S2 and S3, those components will be herein represented by the VCs S1, S2 and S3 for the sake of simplicity. In this case, the VCs. S1, S2 and S3 have been entered. The processing time needed for the VCs S1, S2 and S3 may have turned out to be 50, 20 and 40 cycles, respectively, from the implementability evaluation information (i.e., a database of exemplary realizations) stored on the VC clusters for the VCs. S1, S2 and S3. And the power dissipated by the VCs S1, S2 and S3 may have turned out to be 100, 200 and 100 mW, respectively, from the implementability evaluation information stored on the VC clusters for the VCs S1, S2 and S3. In the illustrated example, all of these values of processing times and power dissipation are supposed to the minimum values MIN thereof.

In this example, the implementability is evaluated in the above-described manner. Specifically, if the percentage of the total (minimum) performance value with a margin to the required performance value (100%) turns out to be equal to or less than 100% by reference to the implementability evaluation information for the VCs, then the implementability is affirmed.

Suppose the requirement on the processing time is that the processing time between the input i1 and the output O1 should be 100 cycles or less and that the processing time between the input i1 and the output O2 should be 50 cycles or less. The (average) processing time between the input i1 and the output O1, calculated from the realizations stored on the VC cluster, is 50+20=70 cycles, which is 70% of the required performance value (i.e., 100 cycles). And the sum of this percentage and the 20% margin is 90%, which is less than 100%. Thus, the path between the input i1 and the output O1 is easily implementable. On the other hand, the processing time between the input i1 and the output O2, calculated from the realizations stored on the VC cluster, is 50+40 =90 cycles, which is 180% of the required performance value (i.e., 50 cycles). And the sum of this percentage and the 20% margin is 200%, which is far greater than 100%. Thus, the path between the input i1 and the output O2 is not easily implementable. As a result, as for the parameter of processing time, the implementability is evaluated as "Low; bottleneck found; processing time between input i1 and output O2 is 90 cycles".

Suppose the requirement on the power dissipation is that the total power dissipated should be 700 mW or less. The power dissipated by the overall system, which is calculated from the realizations stored on the respective VC clusters, is 100 +200+100=400 mW, which is about 71.4% of the required performance value (i.e., 700 mW). And the sum of this percentage and the 20% margin is 91.4%, which is less than 100%. Thus, as for the parameter of power dissipation, the implementability is evaluated as high.

On the other hand, suppose the requirement on the power dissipation is that the total power consumed should be 200 mW or less. The power dissipated by the overall system, which is calculated from the realizations stored on the respective VC clusters, is 400 mW, which is 200% of the required performance value (i.e., 200 mW). And the sum of this percentage and the 20% margin is 220%, which is far greater than 100%. Thus, as for the parameter of power dissipation, the implementability is evaluated as "Low; bottleneck found; power dissipation of VC S2 is 200 mW".

How to Evaluate Implementability with Data Transfer taken into Account

In the foregoing examples, the total processing time is calculated only from the processing times needed for the VCs S1, S2 and S3 and the times needed for data transfer are not taken into account. If the times needed to input or output data were substantially equal among the VCs and if the required performance value did not include any time needed for data transfer, then there would be no problem with the method exemplified above. In an actual system, however, the processing times needed for respective VCs to transfer data are often different from each other. Thus, it will be described how to evaluate the implementability with the data transfer into account. In the following example, the total performance value of the VCs is calculated from the average values AVE thereof and directly compared to the required performance value without adding any margin thereto.

Figure 11:
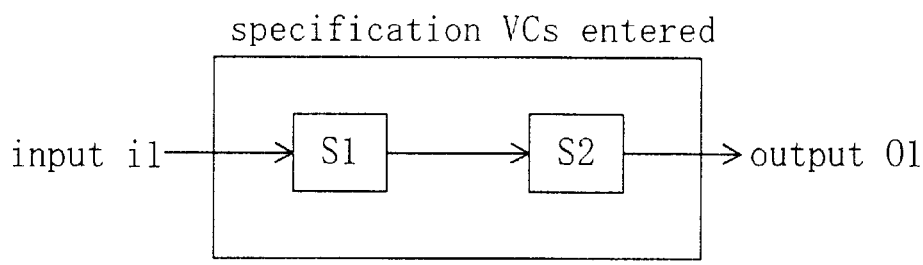
FIG. 11 is a block diagram of a system illustrating how implementability may be evaluated with data transfer taken into account according to the first embodiment.

Suppose a system illustrated in FIG. 11. In this system, after an input i1 has been processed by a VC S1, the processed input is further processed by another VC S2, thereby providing output data O1 to an external system. In this case, the VCs S1 and S2 have been entered. As for the VC S1, the processing time, the time needed for inputting data and the time needed for outputting data may have turned out to be 50, 10 and 20 cycles, respectively, from the implementability evaluation information (i.e., database of exemplary realizations) stored on the VC cluster for the VC S1. As for the VC S2, the processing time, the time needed for inputting data and the time needed for outputting data may have turned out to be 20, 10 and 10 cycles, respectively, from the implementability evaluation information stored on the VC cluster for the VC S2. In the illustrated example, all of these values of processing times are supposed to their average values AVE.

Suppose the requirement on the processing time is that the processing time between the input i1 and the output O1 should be 100 cycles or less. The (average) processing time between the input i1 and the output O1, calculated from the realizations stored on the VC clusters, is 10+50+20+10+20+10=120 cycles, which is 20% greater than the required performance value (i.e., 100 cycles). Thus, the path between the input i1 and the output O1 is not easily implementable. As a result, as for the parameter of processing time, the implementability is evaluated as "Low; bottleneck found; processing time of VC S1 is 50 cycles".

Division of Required Performance Value

Hereinafter, specific examples of the required performance dividing step S5 shown in the flowchart of FIG. 7 will be described.

1) Weighted Division

Suppose a requirement imposed on the system shown in FIG. 11 is that the processing time between the input i1 and the output O1 should be 100 cycles or less. And also suppose that the average processing times needed for the VCs S1 and S2 have turned out to be 50 and 40 cycles, respectively, from the implementability evaluation information stored on the VC clusters. In that case, the required performance value of 100 cycles is divided into two values for these VCs S1 and S2 in the following manner:

S1: 100×{50/(50+40)}=56 cycles

S2: 100×{40/(50+40)}=44 cycles

That is to say, the VCs S1 and S2 should be replaced with VCs needing processing times of 56 and 44 cycles, respectively.

2) Equal Division

In this method, the required performance value of 100 cycles is equally divided into two sets of 50 cycles for the VCs S1 and S2. That is to say, the VCs S1 and S2 should be replaced with two VCs each needing a processing time of 50 cycles.

3) Division with Data Transfer into Account

The data used for the implementability evaluation shown in FIG. 11, in which the total processing time is estimated with the time needed for data transfer taken into account, will be used again for this example.

In this example, the processing time needed for the VC S1, including the time needed for inputting and outputting data, is 50+10+20=80 cycles. On the other hand, the processing time needed for the VC S2, including the time needed for inputting and outputting data, is 20+10+10=40 cycles. In that case, the required performance value of 100 cycles is divided into two values for these VCs S1 and S2 in the following manner:

S1: 100×{80/(80+40)}=66.7 cycles

S2: 100×{40/(80+40)}=33.3 cycles

That is to say, the VCs S1 and S2 should be replaced with VCs needing processing times of 66.7 and 33.3 cycles, respectively.

As for the other parameters like layout area and power dissipation, a performance division like this is carried out, thereby determining the parameters that should be met by the respective VCs for the rest of the design process.

How to Change Specification

Hereinafter, it will be described how to change the specification if the implementability of the system shown in FIG. 9 is negated.

Suppose the processing times between the input i1 and the medium output O1, between the input i1 and the memory output O2 and between the input i1 and the monitor output O3 should be equal to or less than 500, 500 and 100 cycles, respectively.

On the other hand, suppose the results of the implementability evaluation, which has been performed using minimum processing times MIN derived from the implementability evaluation information stored on the respective VCs S1 through S6, are as follows. The required processing times between the input i1 and the medium output O1 and between the input i1 and the memory output O2 are easily realizable, but the required processing time between the input i1 and the monitor output O3 is not easily realizable.

In that case, the process returns to Step ST1 to change the specification itself, e.g., omit the VCs S2 and S5 from the signal path leading from the VC S1 to the VC S6 as indicated by the dashed line in FIG. 9. By changing the specification in this manner, the processing by the VC S6 can be performed just after the processing by the VC S1 is finished. As a result, the required processing time gets easily realizable. In the example illustrated in FIG. 9, the image is originally supposed to be compressed by the VC S2 and then the image compressed is supposed to be expanded and verified by the VC S5. However, now that it is clear that the required performance cannot be met with this redundant verification process, the verification process is abandoned and the system is re-designed to adopt the second best policy of sending the image data directly to the monitor output O3. This is because it is expected that the performance will not be seriously affected even if the path is changed this way.

By modifying the specification within the permitted range depending on the result of implementability evaluation, a design deadlock, which will otherwise result from overly rigorous specification, is avoidable. Particularly, since system LSIs are expected to further increase their scales from now on, such design deadlocks will possibly occur more and more often after a needless, lengthy exploration of multiple architectural alternatives down to the lowermost design level. However, if the specification is modified (e.g., the required performance is graded down by one unit) in accordance with the result of implementability evaluation at the higher level, the designers need not pursue designs that will never work.

Implementability Evaluation with VCs reused

In the foregoing description, the implementability is supposed to be evaluated with all the VCs that will make up a system newly entered from the VCDB and newly designed from scratch. In the following example, it will be described how to evaluate the implementability in a situation where almost all the VCs for a system have already been fixed and just a few of them should be yet to be modified.

For example, suppose the system shown in FIG. 9, i.e., an LSI for a digital still camera, should be designed with only the image compression VC S2 replaced with a new VC S2' and with ready-made VCs reused as the other VCs S1 and S3 through S6.

Figure 12:
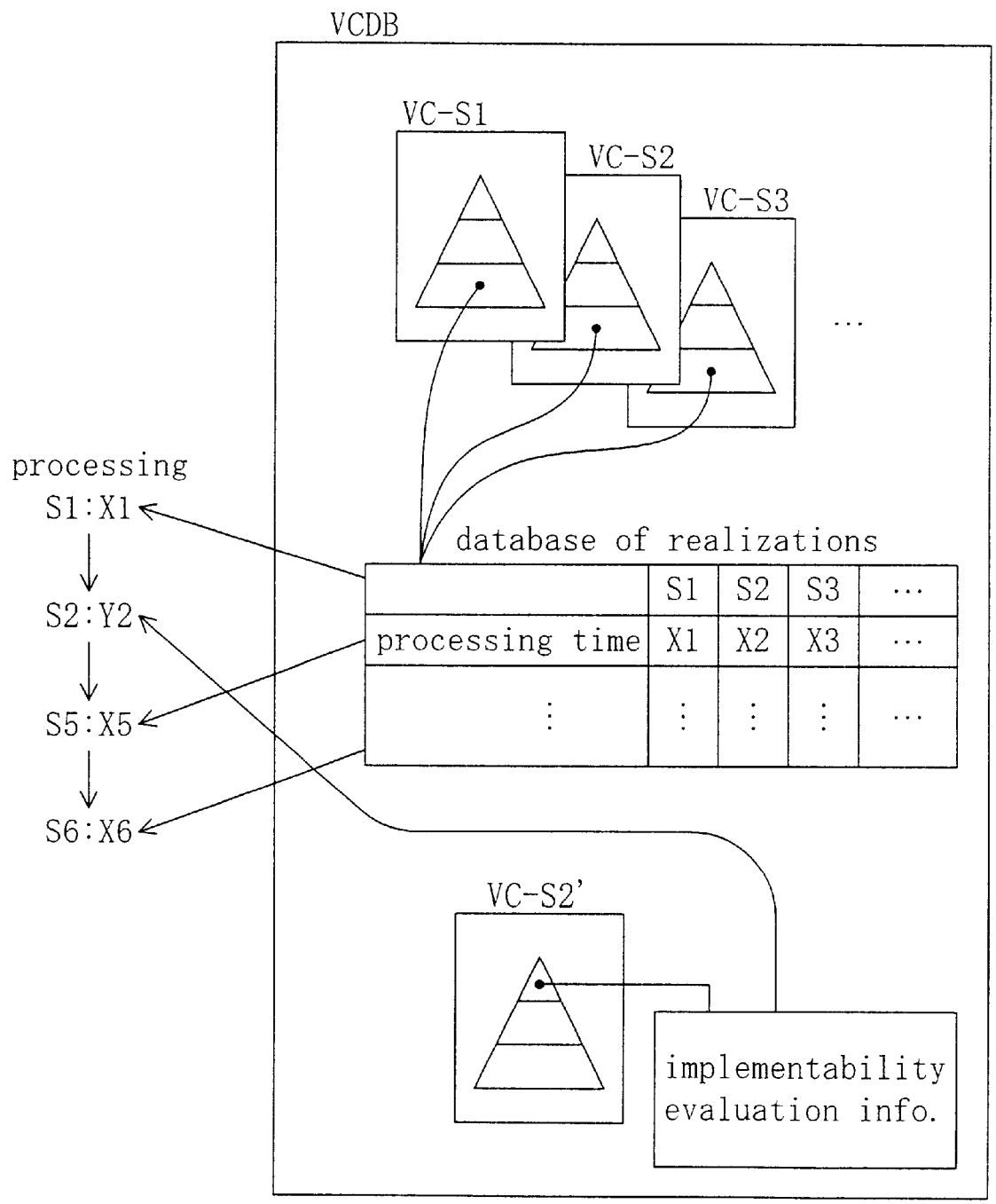
FIG. 12 is a block diagram of a system illustrating how implementability may be evaluated with VCs reused according to the first embodiment.

FIG. 12 illustrates how to evaluate the implementability using the processing time between the input i1 and the monitor output O3 as a performance parameter of this system. As shown in FIG. 12, the VCDB has six VCs S1 through S6 that have already been fixed. For the RT layers in the VC clusters of these VCs S1 through S6, a database of exemplary realizations has been constructed. In the database, data about the processing times needed for the respective VCs S1 through S6 is described. As for the VCs S1 and S3 through S6 that will not be changed, the data already registered for these VCs S1 and S3 through S6 will be reused.

Thus, in evaluating the implementability using the processing time between the input i1 and the monitor output O3 as a parameter, the VCs S1, S5 and S6 that will not be changed are entered from the VCDB in Step ST1 shown in FIG. 7. In Step S4 shown in FIG. 7, the processing times X1, X5 and X6 described in the RT layers of the VCs. S1, 55 and S6 are retrieved. As for the VC S2 to be modified on the other hand, a data item Y2 of the implementability evaluation information, stored on the specification layer of the VC S2' that has been newly entered from the VCDB, is used. Then, the total processing time needed for this path, i.e., (X1+Y2+X5+X6), is compared to the required processing time, thereby evaluating the implementability.

In this case, any of the various methods exemplified above may be used. For example, the processing time data Y2 may be an average value AVE thereof and the implementability may be evaluated depending on whether or not the total processing time is equal to or shorter than the required processing time. Alternatively, the processing time data Y2 may be a minimum value MIN thereof. In that case, the percentage of the total processing time to the required processing time may be obtained. And if the sum of this percentage and the margin is 100% or less, then the implementability may be affirmed. Furthermore, if the times needed for inputting and outputting data is taken into account, the times needed for inputting and outputting data to/from the VC S2' and the processing time needed by the VC S2' itself may be retrieved from the implementability evaluation information of the VC S2'.

Embodiment 2

Figure 13:
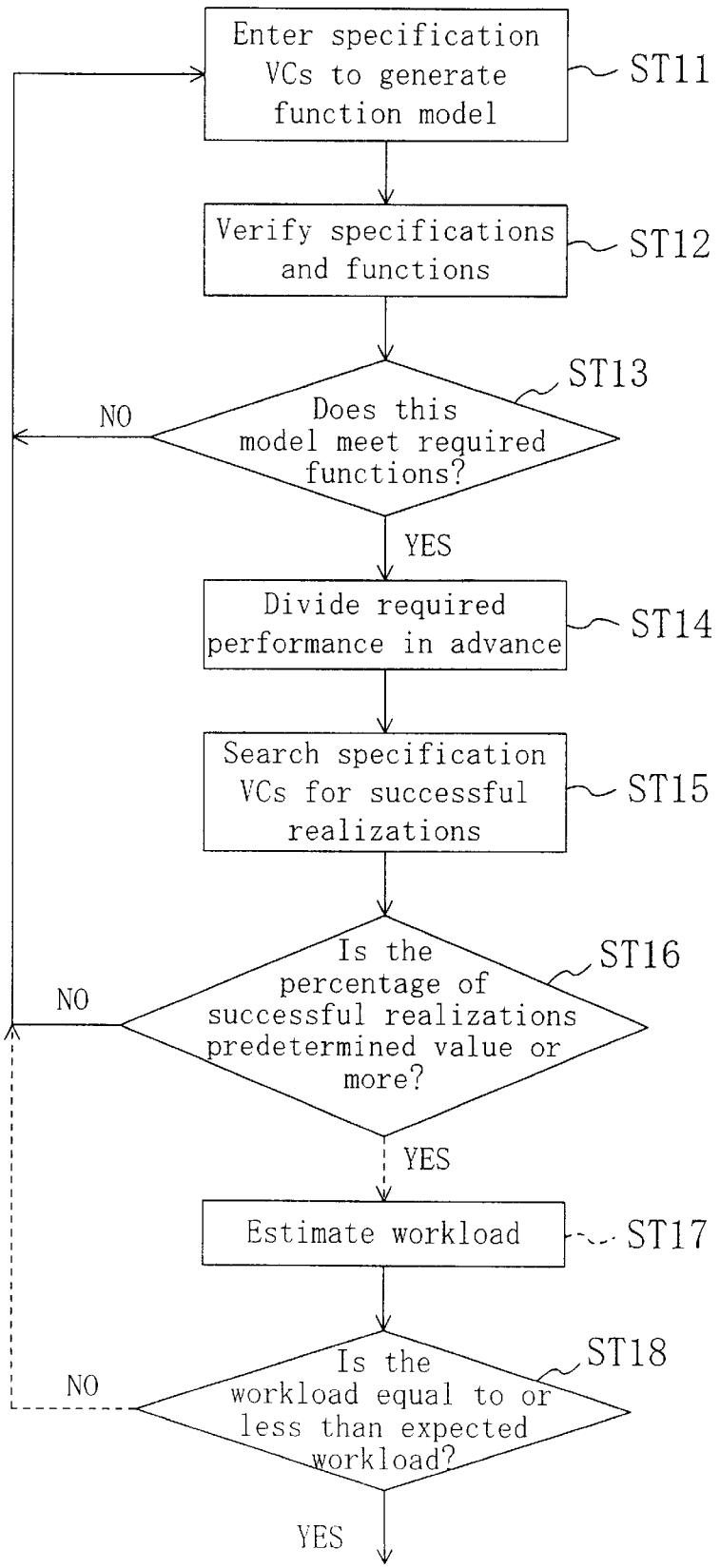
FIG. 13 is a flowchart illustrating respective design process steps at the specification level according to a second embodiment of the present invention.

Next, a second embodiment of the present invention will be described. In the second embodiment, the implementability is evaluated with the required performance value divided in advance. FIG. 13 is a flowchart illustrating respective design process steps at the specification level according to the second embodiment.

Steps ST11, ST12 and ST13 are the same as the counterparts ST1, ST2 and ST3 of the first embodiment.

Figure 14:
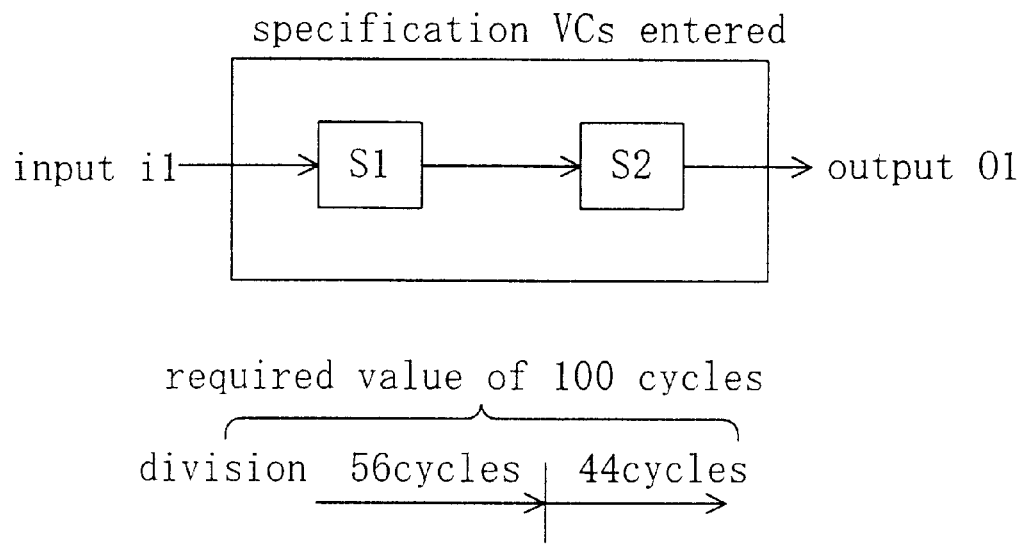
FIG. 14 is a block diagram of a system illustrating how a required performance value can be divided in advance according to the second embodiment.

Next, in step ST14, the required performance value is divided in advance. For example, suppose the required processing time between the input i1 and the output O1 is 100 cycles. Then, as shown in FIG. 14, this required processing time of 100 cycles is divided into 56 and 44 cycles for the VCs S1 and S2, respectively, as in Step ST5 of the first embodiment.

Next, in Step ST15, the specification VCs for these VCs S1 and S2 are searched for realizations meeting those divided performance requirements. For example, suppose the minimum processing times described in the implementability evaluation information stored on the specification VCs for the VCs S1 and S2 are 60 and 43 cycles, respectively. In that case, there are no realizations attaining the processing time of 56 cycles required for the VC S1, but there is at least one realization attaining the processing time of 44 cycles required for the VC S2.

Then, in Step ST16, it is determined whether or not the percentage of realizations, meeting the performance requirement (which will be herein called "successful realizations"), is a predetermined value or more. As for the VCs S1 and S2, the percentage of successful realizations is 50%. Thus, supposing the predetermined value for the evaluation is 60%, then the implementability is negated. As a result, the implementability is evaluated as "Low; bottleneck found; processing time of VC S1 is 60 cycles", for example.

If the implementability is negated, then the process returns to Step ST11, in which VCs meeting the requirements are newly generated or the requirements are relaxed without generating any new VCs. And then Steps ST12 through ST16 will be repeatedly performed until all of the requirements are satisfied. Optionally, the implementability may also be evaluated depending on whether or not VCs meeting the requirements can be generated easily.

By repeatedly performing Steps ST11 through ST16 in this manner, a system, which is deemed implementable at this time, is obtained.

Thereafter, optional steps ST17 and ST18 may be performed. specifically, in Step ST17, the total workload is estimated provisionally based on the number of VCs to be newly generated. Then, in Step ST18, it is determined whether or not the estimated workload is equal to or less than an expected workload. And if the answer is NO, then the process may return to Step ST11. In this manner, the specification may sometimes be re-defined depending on the estimated workload.

Figure 15:
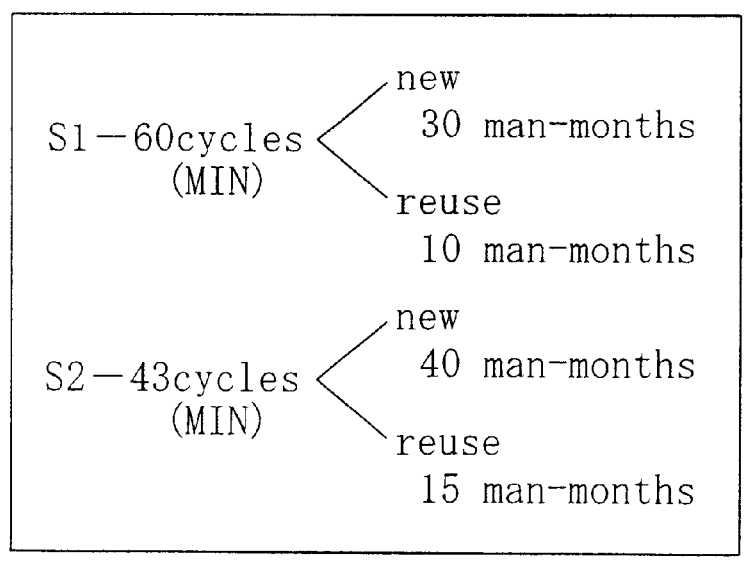
FIG. 15 illustrates workload estimation information stored on the VCDB according to the first or second embodiment.
Figure 16:
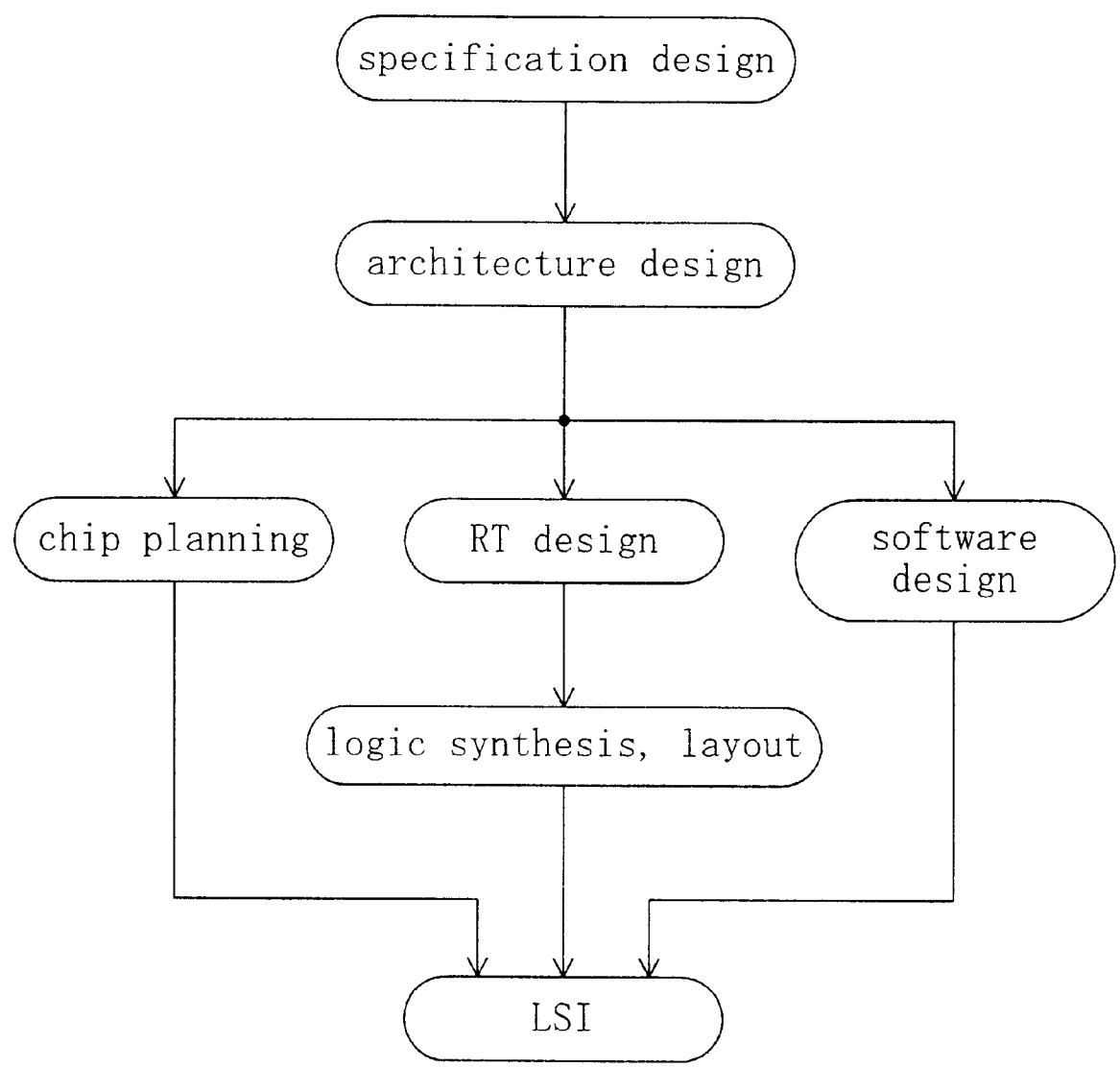
FIG. 16 is a flowchart illustrating known process steps for designing an LSI.

FIG. 15 illustrates workload estimation information stored on the VCDB. In the illustrated embodiment, the workload estimation information is represented in terms of a product of the estimated number of workers and the estimated number of months needed for carrying out the design process. As shown in FIG. 15, the number of workers multiplied by the number of months needed for newly developing VCs and the number of workers multiplied by the number of months needed when existent VCs are reused are stored as the workload estimation information on each specification VC within the VCDB. In evaluating the implementability, if there is at least one successful realization for each VC, then the realization (or the ready-made VC) is supposed to be reused. Otherwise, a new VC is supposed to be developed. The estimated workload needed for newly developing a VC can be retrieved from a database consisting of the workloads that were needed in newly developing the RTL-VCs existing in the VC clusters for the specification VCs. On the other hand, the estimated workload needed when existent RTL-VCs are reused can be retrieved from a database consisting of the workloads that were needed in reusing the RTL-VCs existing in the VC clusters for the specification VCs.

In the design of the system shown in FIG. 14, there are no successful realizations attaining the processing time of 56 cycles required for the VC S1. This is because the processing time described for the VC S1 in the implementability evaluation information stored on the specification VC within the VCDB is 60 cycles. On the other hand, there is at least one successful realization attaining the processing time of 44 cycles required for the VC S2. This is because the processing time described for the VC S2 in the implementability evaluation information stored on the specification VC within the VCDB is 43 cycles. Suppose an alternative VC should be newly developed for the VC S1 without relaxing the requirements when the process returns to Step S11. Then, the estimated workload needed is 30 man-months. As for the VC S2 on the other hand, existent VCs. may be reused. So the estimated workload needed is 15 man-months. Accordingly, the total workload needed is estimated to be 45 man-months.

By estimating the workload in this manner, the number of designers needed can be known in advance with the estimated workload and the due date compared to each other.

It should be noted that even if existent VCs are reused for all the VCs or if all the VCs are newly developed, the workload may also be estimated. The specification may sometimes be re-defined depending on the estimated workload.

In the foregoing embodiment, the workload is estimated in Step ST17 of the flowchart illustrated in FIG. 13, but this workload estimation may also be performed in Step ST6 of the flowchart illustrated in FIG. 7. In the latter case, 15 an alternative VC may have to be newly developed when the process returns to Step ST1.

According to the inventive method for designing an integrated circuit device, a database is prepared to evaluate the implementability of required performance at the specification level, or the highest level of a design process. Thus, a needless, lengthy exploration of multiple architectural alternatives or a design deadlock, which usually results from overly rigorous requirements, is avoidable. As a result, even a very-large-scale integrated circuit device can be designed easily.

What is claimed is:

1. A database for storing thereon data needed in designing an integrated circuit device that will be made up of a plurality of components, the database comprising:
   a virtual core (VC) cluster, on which the data needed in designing the components is separately stored at least for a specification VC and a register-transfer-level VC (RTL-VC), and
   implementability evaluation information stored for the specification VC, the information representing performance of the RTL-VC in accordance with a specification defined by the specification VC in the VC cluster.

2. The database of claim 1, wherein the implementability evaluation information contains data about at least one of processing time, layout area, power dissipation and test cost.

3. The database of claim 1, wherein the implementability evaluation information contains data about at least processing time and a time needed for inputting or outputting data.

4. The database of claim 1, wherein if there are multiple RTL-VCs associated with the specification, then the implementability evaluation information contains the data as at least one of minimum, average, maximum and optimum values that are parameters representing the performance of each said RTL-VC.

5. The database of claim 1, further comprising workload estimation information stored for the specification VC, the information representing a workload needed for newly developing a VC in accordance with the specification and a workload needed for reusing the VC in accordance with the specification, which are included in the implementability evaluation information.

6. A database for storing thereon data needed in designing an integrated circuit device that will be made up of a plurality of components, the database comprising:
   a virtual core (VC) cluster, on which the data needed in designing the components is separately stored at least for a specification VC and a register-transfer-level VC (RTL-VC), and
   workload estimation information stored for the specification VC, the information representing a workload needed for newly developing a VC in accordance with a specification defined by the specification VC and a workload needed for reusing the VC in accordance with the specification.

7. The database of claim 1, wherein the specification VC is combined with an architecture VC to form a single specification/architecture VC.

8. A method for designing an integrated circuit device, which will be made up of a plurality of components, using a database, the database comprising: a virtual core (VC) cluster, on which the data needed in designing the components is separately stored at least for a specification VC and a register-transfer-level VC (RTL-VC); and implementability evaluation information stored for the specification VC, the information representing performance of the RTL-VC in accordance with a specification defined by the specification VC, the method comprising the steps of:
   a) entering the specification VCs corresponding to the respective components; and
   b) evaluating the implementability of the integrated circuit device being designed using the specification VCs entered in accordance with the implementability evaluation information stored for the specification VCs.

9. The method of claim 8, wherein the implementability evaluation information contains data about at least one of processing time, layout area, power dissipation and test cost, and
   wherein the step b) is performed with at least one of the processing time, layout area, power dissipation and test cost used as a parameter.

10. The method of claim 8, wherein the implementability evaluation information contains data about at least a processing time and a time needed for inputting or outputting data, and
    wherein the step b) is performed with a time needed for transferring data and the processing time used as parameters.

11. The method of claim 8, wherein the implementability evaluation information contains the data as at least one of minimum, average, maximum and optimum values that are parameters representing the performance of each said RTL-VC, and
    wherein the step b) is performed based on at least one of the minimum, average, maximum and optimum values of the parameters.

12. The method of claim 8, wherein the step b) is performed by comparing a required value of the performance of the VCs to an estimated value of the performance, the estimated value being derived from the implementability evaluation information stored on the specification VCs.

13. The method of claim 12, wherein the step b) is performed with the estimated performance value of the VCs evaluated by percentage on the sup position that the required performance value is 100%.

14. The method of claim 12, wherein the step b) is performed with one of the VCs that has the lowest implementability extracted as a bottleneck as for a performance.

15. The method of claim 12, wherein in the step b), reusable ones of the components are provided with the performance of the RTL-VCs, corresponding to the components, in the VC cluster, while the other components are provided with the performance defined by the implementability evaluation information stored for the specification VCs, corresponding components, in the VC cluster.

16. The method of claim 12, wherein if a function model with exemplary design realizations is reused and part of components of the model are changed to make a modified function model, then reusable ones of the components are provided in the step b) with the performance of the RTL-VCs in the VC cluster that has been applied to the exemplary design realizations.

17. The method of claim 12, further comprising the step of dividing the required performance value into multiple values, which have been weighted for the respective VCs corresponding to the components, after the step b) has been performed.

18. The method of claim 12, further comprising the step of equally dividing the required performance value for the respective VCs corresponding to the components after the step b) has been performed.

19. The method of claim 17, wherein workload estimation information is further stored on the specification VCs of the database, the information representing a workload needed for newly developing a VC in accordance with the specification and a workload needed for reusing the VC in accordance with the specification, and wherein the method further comprises the step of estimating a workload needed for each said component by reference to the workload estimation information stored for the specification VCs corresponding to the respective components after the step of dividing has been performed.

20. The method of claim 8, further comprising the step of dividing the required performance value for the respective VCs between the steps a) and b), wherein the step b) is performed by determining, in accordance with the implementability evaluation information stored for the specification VCs corresponding to the respective components, whether or not realizations, meeting the divided performance values, account for a predetermined percentage or more.

21. The method of claim 20, wherein the required performance value is divided into multiple values weighted for the respective VCs.

22. The method of claim 20, wherein the required performance value is equally divided for the respective VCs.

23. The method of claim 20, wherein the step b) is performed with one of the VCs that has the lowest implementability extracted as a bottleneck as for a performance.

24. The method of claim 20, wherein workload estimation information is further stored for the specification VCs of the database, the information representing a workload needed for newly developing a VC in accordance with the specification and a workload needed for reusing the VC in accordance with the specification, and wherein the method further comprises the step of estimating a workload needed for each said component by reference to the workload estimation information, stored on the specification VCs corresponding to the respective components, after the step b) has been performed.

25. A database for storing thereon data needed in designing an integrated circuit device that will be made up of a plurality of components, the database comprising:

a virtual core (VC) cluster, on which the data needed in designing the components is separately stored at least for a specification VC and a register-transferlevel VC (RTL-VC), and implementability evaluation information stored for the specification VC, the information representing performance of the RTL-VC in accordance with a specification defined by the specification VC in the VC cluster, said specification VC is determined in accordance with an external specification and a plurality of RTL-VCs realizing the external specification, wherein the specification VC and the RTL-VCs are included in the same cluster.

* * * * *